United States Patent [19]
Nishio et al.

[11] Patent Number: 5,946,402
[45] Date of Patent: Aug. 31, 1999

[54] SIGNAL PROCESSING DEVICE FOR PROCESSING SOUND QUALITY, AND RECORDING APPARATUS, REPRODUCING APPARATUS AND MIXING APPARATUS PROVIDED WITH THE SIGNAL PROCESSING DEVICE APPLIED THERETO

[75] Inventors: Ayataka Nishio, Kanagawa; Yuji Tsuchida, Tokyo, both of Japan

[73] Assignee: Sony Corporation, Tokyo, Japan

[21] Appl. No.: 08/838,990

[22] Filed: Apr. 23, 1997

[30]    Foreign Application Priority Data

Apr. 30, 1996  [JP]  Japan ..................... 8-109750

[51] Int. Cl.$^6$ .............. H03G 5/00; H04B 1/00

[52] U.S. Cl. ................ 381/103; 381/111; 381/119

[58] Field of Search ................ 381/101–109, 381/119, 111; 84/624, 625, 647, 660, 694, 697

[56]    References Cited

U.S. PATENT DOCUMENTS

| | | | |
|---|---|---|---|
| 5,347,587 | 9/1994 | Takahashi et al. | 381/111 |
| 5,418,859 | 5/1995 | Cho | 381/103 |
| 5,493,699 | 2/1996 | Shioda et al. | 381/106 |
| 5,592,403 | 1/1997 | Trager et al. | 381/104 |
| 5,592,559 | 1/1997 | Takahashi et al. | 381/111 |
| 5,774,567 | 6/1998 | Heyl | 381/119 |
| 5,825,899 | 10/1998 | Yamaguchi et al. | 381/119 |

*Primary Examiner*—Paul Loomis
*Assistant Examiner*—Xu Mei
*Attorney, Agent, or Firm*—Jay H. Maioli

[57]    ABSTRACT

In controlling a sound quality of a one-bit digital signal, a signal processing device takes the operating steps of separating the digital signal into two bands, an audible band and a higher band than the audible band, performing a sound quality of the audible band only, and adding the processed band to the other higher band than the audible band. This operation makes it possible for the signal processing device to control the sound quality as keeping the high dynamic range and wide band that are proper to a one-bit digital signal. The signal processing device may apply to a reproducing apparatus and a recording apparatus.

24 Claims, 8 Drawing Sheets

SIGNAL PROCESSING DEVICE FOR PROCESSING SOUND QUALITY, AND RECORDING APPARATUS, REPRODUCING APPARATUS AND MIXING APPARATUS PROVIDED WITH THE SIGNAL PROCESSING DEVICE APPLIED THERETO

BACKGROUND OF THE INVENTION

1. Field of the Invention

The present invention relates to a signal processing device for performing an adjusting process of sound quality such as equalizing with respect to a one-bit digital signal obtained by the sigma-delta ($\Sigma\Delta$) modulation, a signal recording apparatus for recording the digital signal that is subject to the adjustment of sound quality, and a signal reproducing apparatus for performing the adjustment of sound quality with respect to the one-bit digital signal obtained by the sigma-delta modulation before reproduction.

2. Prior Art

As a method for digitizing an audio signal, there has been known the method for modulating an analog audio signal into a multi-bit audio signal with a quantizing bit length of 16 bits sampled at a sampling frequency of 44.1 KHz.

Recently, the method called the sigma-delta ($\Sigma\Delta$) modulation is executed for digitizing the audio signal so that the resulting one-bit audio signal is treated as it is.

The one-bit audio signal obtained by the sigma-delta modulation is formatted to have 64 times as great a sampling frequency as the conventional multi-bit audio signal whose sampling frequency is 44.1 KHz and has a quantizing bit as short as as one bit, and has a wide transmittable frequency band. The one-bit audio signal can secure a higher dynamic range than the conventional multi-bit audio signal in an audio band.

Of course, it is necessary to perform a sound effect treatment such as equalizing realized in the multi-bit audio signal even with respect to the one-bit audio signal.

Figure 1:
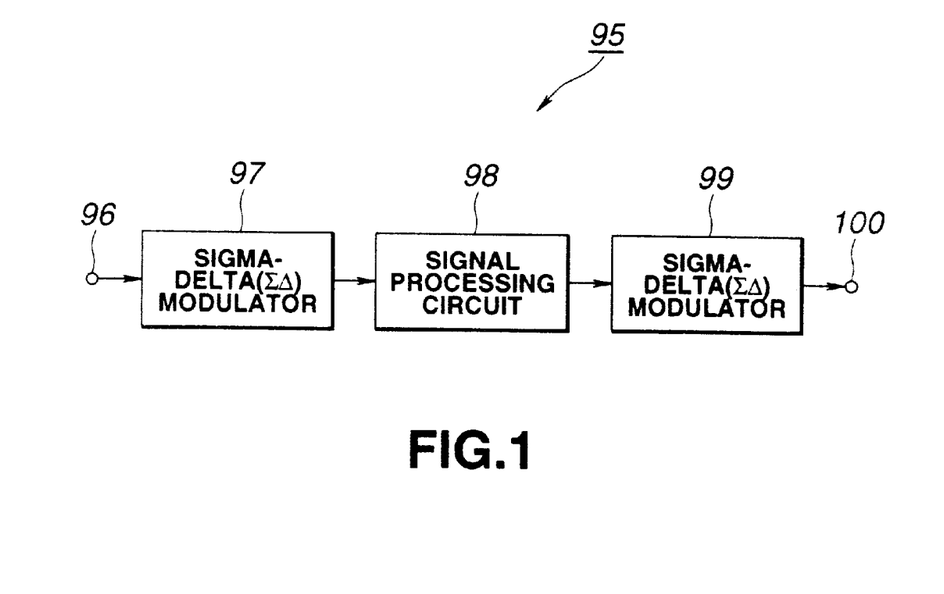
FIG. 1 is a block diagram showing a conventional arrangement for processing a one-bit digital signal.

For example, FIG. 1 shows the most fundamental arrangement of the so-called equalizing process for adjusting a frequency characteristic by amplifying and attenuating a specific band of an audible band.

In the signal processing apparatus shown in FIG. 1, an analog audio signal is applied at an input terminal 96 and then is supplied to a sigma-delta modulator 97. The sigma-delta modulator 97 operates to modulate the input analog audio signal into a one-bit digital signal through the sampling frequency 64×fs that is 64 times as great as the sampling frequency fs (=44.1 KHz) used in the current compact disk.

The one-bit digital signal that is output from the sigma-delta modulator 97 is supplied to a signal processing circuit 98 for PCM (Pulse Code Modulation). The signal processing circuit 98 performs an equalizing process with respect to the input one-bit digital signal.

The equalized signal that is an output signal of the signal processing circuit 98 is supplied to another sigma-delta modulator 99 in which the equalized signal is modulated back to the one-bit digital signal. Then, the one-bit digital signal is supplied to an output terminal 100.

The signal processing circuit 98 for PCM provides a sampling frequency 64×fs to be used for processing the one-bit digital signal. If the signal processing circuit 98 is composed of digital signal processors (DSP), for example, the circuit 98 would need a lot DSPs. Since the audio band has a far lower frequency than the sampling frequency 64×fs, the signal processing circuit 98 is required to have greater number of bits for obtaining the desired characteristic. This results in making the overall system greater in scale and cost.

SUMMARY OF THE INVENTION

The present invention is made in consideration of the aforementioned conditions, and it is an object of the present invention to provide a signal processing device, a signal recording apparatus, and a signal reproducing apparatus which are arranged to implement signal processing such as equalizing with small-scaled and less costly hardware.

The present invention is achieved by a signal processing device for processing a digital signal with one quantizing bit processed at a sampling frequency N×fs (Hz) (N is 2 or more integer and fs'×2≦fs (Hz) where fs' is an audible band frequency) through the effect of a sigma-delta modulating system, which includes: a first converter for converting the one-bit digital signal into a digital signal having a sampling frequency fs (Hz) and quantizing multi-bits; a signal processor for processing the digital signal having the sampling frequency fs (Hz) and the quantizing multi-bits converted by the first converter; a first delay unit for delaying the digital signal having the sampling frequency fs (Hz) and the quantizing multi-bits converted by the first converter by a predetermined time; a second delay unit for delaying a digital signal having a sampling frequency N×fs (Hz) and one quantizing bit obtained through the effect of the sigma-delta modulating system by a predetermined time; a first calculator for operating a difference between an output signal of the signal processor and an output signal of the first delay unit; a second converter for converting the difference result of the first calculator into a digital signal having the sampling frequency N×fs (Hz) and quantizing multi-bits; a second calculator for adding an output signal of the second converter to an output signal of the second delay unit; and a sigma-delta modulator for re-quantizing the added result of the second calculator into a digital signal having the sampling frequency N×fs (Hz) and one quantizing bit.

Further, the present invention offers a reproducing apparatus or a recording apparatus in which the signal processing apparatus is mounted.

Moreover, the present invention offers a mixing apparatus provided with the signal processing device applied thereto, for mixing each one-bit digital signal of multi-channels with the output of the signal processing apparatus.

DESCRIPTION OF THE PREFERRED EMBODIMENTS

Hereafter, the description will be oriented to a signal processing device, a signal recording apparatus, and a signal reproducing apparatus along the preferred embodiments of the present invention.

Figure 2:
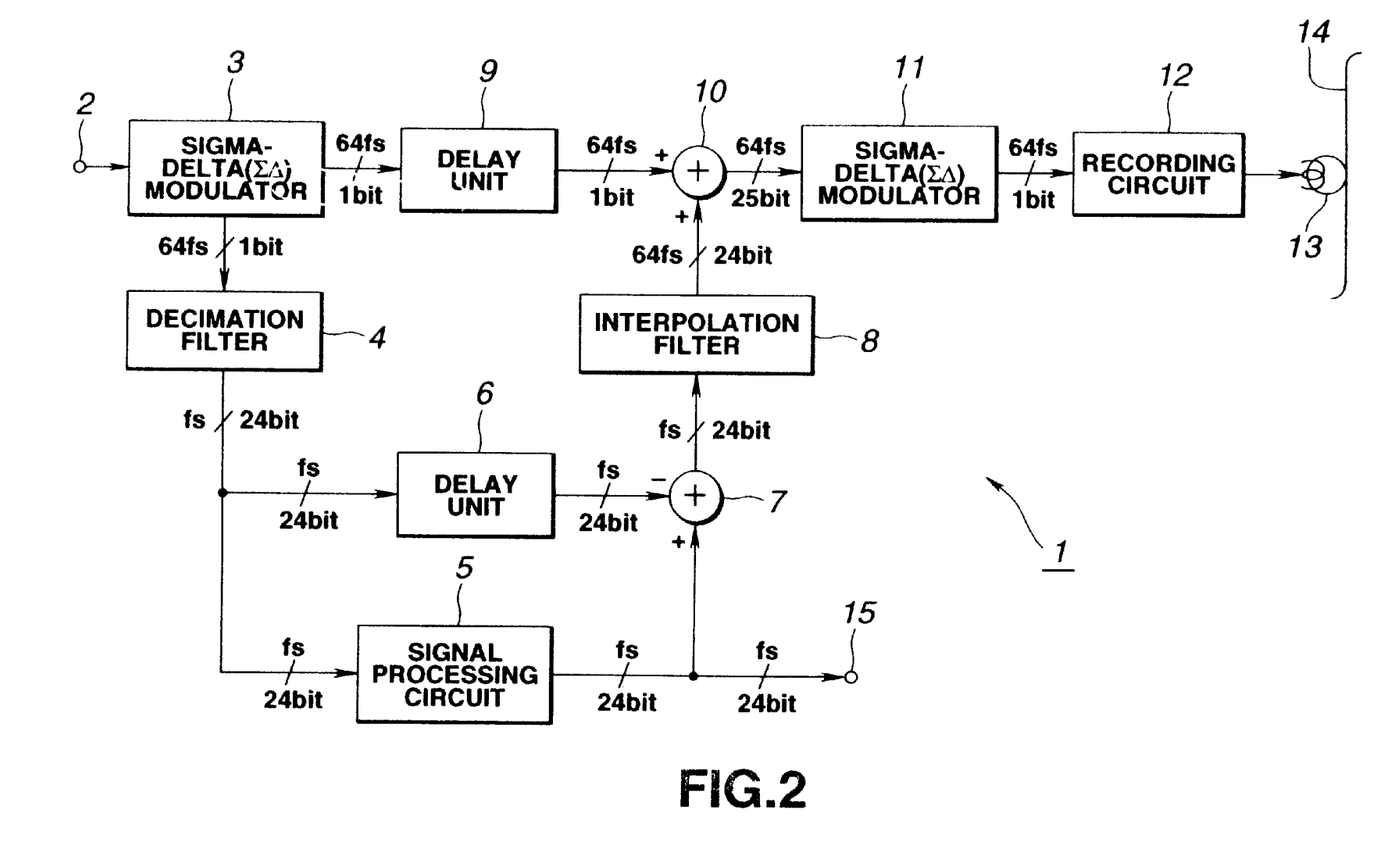
FIG. 2 is a block diagram showing an arrangement for processing a one-bit digital signal according to a first embodiment of the present invention.

The first embodiment of the invention will be described with reference to FIG. 2. The first embodiment includes a signal recording apparatus 1 arranged to perform a sound quality adjusting process such as an equalizing process with respect to a one-bit digital signal sigma-delta modulated by a sigma-delta modulator 3 through the effect of sigma-delta modulation, and to perform a recording process with respect to the adjusted signal through a recording circuit 12, recording the resulting signal on a magnetic tape 14.

The one-bit sigma-delta digital signal from the sigma-delta modulator 3 is generated by sampling at a sampling frequency 64×fs that is 64 times as great as the sampling frequency fs (=44.1 KHz) used in a compact disk.

Later, the signal recording device 1 will be described.

An analog audio signal is applied at an input terminal 2 and then is supplied to the sigma-delta modulator 3 in which the analog audio signal is sigma-delta modulated into a one-bit sigma-delta modulated signal having the sampling frequency 64×fs (called a 64×fs/1-bit digital signal). The 64 fs/1-bit digital signal modulated by the sigma-delta modulator 3 is down-sampled by a decimation filter 4. In the signal processing circuit 5, the sound quality adjustment such as equalizing is executed with respect to the fs/24-bit digital signal from the decimation filter 4. Then, a delay unit 6 operates to delay the fs/24-bit digital signal that is an output signal of the decimation filter 4 by a time corresponding to the processing time consumed in the signal processing circuit 5. Next, a subtracter 7 operates to subtract the fs/24-bit digital output signal from the signal processing circuit 5 from the fs/24-bit digital delaying signal from the delay unit 6. In turn, an interpolation filter 8 is operated to over-sample the difference from the subtracter 7 on the 24-bit digital signal sampled at the sampling frequency 64×fs (called the 64×fs/24-bit digital signal). The 64×fs/1-bit digital signal from the sigma-delta modulator 3 is delayed by a delay unit 9 by a time consumed in passing the signal through the decimation filter 4, the signal processing circuit 5, the subtracter 7, and the interpolation filter 8. The 64×fs/24-bit digital signal from the interpolation filter 8 is added to the 64×fs/1-bit digital signal from the delay unit 0 in an adder 10. The 64×fs/25-bit digital signal from the adder 10 is modulated back into the 64×fs/1-bit digital signal through the sigma-delta modulator 11. The 64×fs/1-bit digital signal from the sigma-delta modulator 11 is processed for recording by a recording circuit 12. A stream of a one-bit digital signal processed for recording by the recording circuit 12 is recorded on a magnetic tape 15 through a recording head 13.

In general, the equalizing process is mainly intended for adjusting a frequency characteristic. Hence, it just needs to handle only an audible frequency band. Practically, it does not need to handle the band that exceeds the audible frequency band. That is, from a practical point of view, the equalizing process performs only the operation at the sampling frequency that covers the component of the audible frequency band.

Hence, the one-bit digital signal sampled at the sampling frequency 64×fs is down-converted into the minimum processable signal level of an audible band component. The down-converted signal may be practically enough for the equalizing process. Hence, this equalizing process makes it possible to reduce the hardware amount.

However, if the down-conversion of 64×fs/1-bit digital signal that is an original signal lowers the sampling frequency to fs, for example, for realizing the equalizing process, it can reduce the amount of operations but delete information contained out of the audible band. Hence, it may lose a merit entailed by the one-bit digital signal sampled at high speed.

In order to overcome this shortcoming, this signal recording apparatus 1 is arranged so that the 64×fs/1-bit digital signal from the signal-delta modulator 3 is branched into the decimation filter 4 side and the delay unit 9 side.

In the system of the decimation filter 4, the one-bit signal sampled at the sampling frequency 64×fs is down-converted to a minimum processable signal level of an audible band by the decimation filter 4.

The down-converted output from the decimation filter 4 is equalized by the signal processing circuit 5.

The delaying signal from the delay unit 6 is subtracted from the output from the equalizing process through the subtracter 7. This subtraction makes it possible to extract only the audible band to be equalized by the signal processing circuit 5. The fs/24-bit digital signal containing only the audible band is over-sampled on the 64×fs/24-bit digital signal through the interpolation filter 8 and then is added to the delayed output from the delay unit 9 located on the other branched system through the effect of an adder 10.

The adder 10 operates to add the 64×fs/24-bit digital signal containing the equalized audible band obtained by one system to the 64×fs/1-bit digital signal containing the information out of the audible band by the other system, and then the resulting 64×fs/25-bit digital signal is supplied to the sigma-delta modulator 11.

The sigma-delta modulator 11 operates to generate the 64×fs/1-bit digital signal again and then supply it to the recording circuit 12. The recording circuit 12 performs the recording process with respect to the 64×fs/1-bit digital signal.

Figure 3:
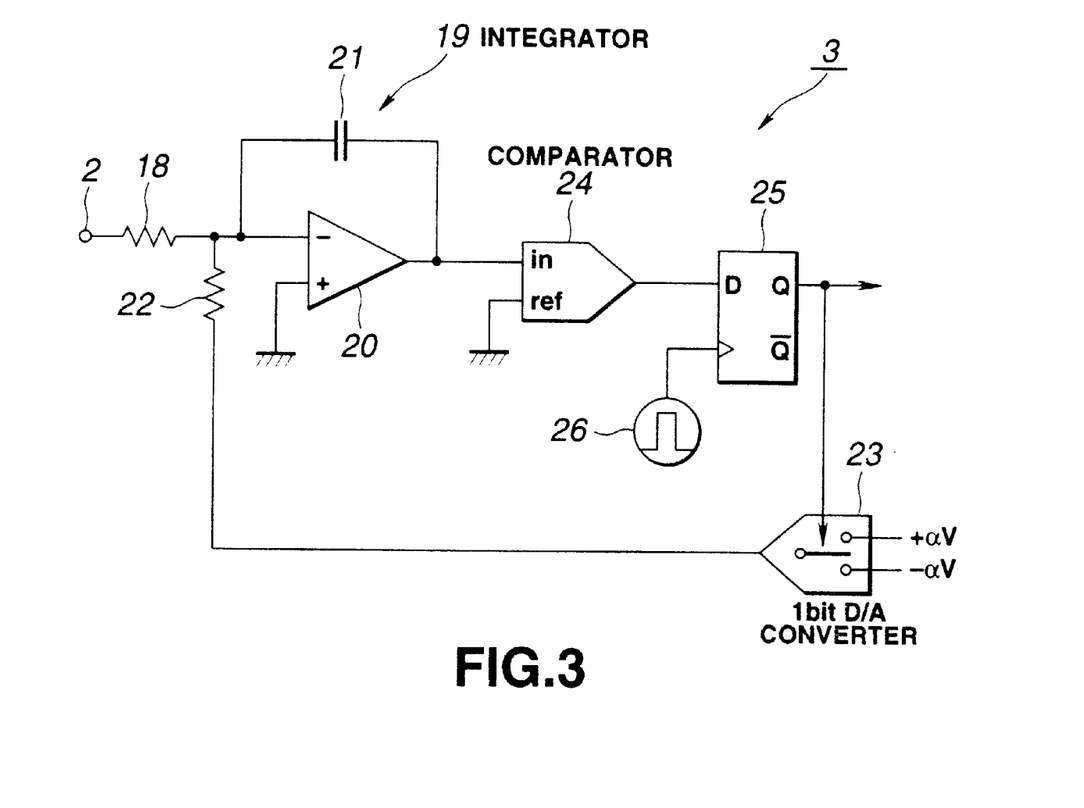
FIG. 3 is a block diagram showing an interior of a sigma-delta modulator applied to the present invention.

The concrete arrangement of the sigma-delta modulator 3 is shown in FIG. 2. The analog audio signal from the input terminal 3 is applied to an inverted input terminal (−) of an operational amplifier 20 through a resistor 18. The output of a one-bit D/A converter 23 is applied to an inverted input terminal (−) of the operational amplifier 2.

Between the inverted input terminal (−) and the output of the operational amplifier 20, a capacitor 21 is inserted so that the operational amplifier 20 and the capacitor 21 compose an inverted integrator 19 as a whole. The voltage composed by integrating the difference current between the input signal and the feedback one-bit signal is output from the operational amplifier 20 into a comparator 24.

The comparator 24 operates to output a value of "1" to a D latch 25 if the operational amplifier 20 feeds zero or a higher voltage or a value of "0" if the operational amplifier 20 feeds a lower voltage than zero to the D latch 25.

The D latch 25 operates to latch the output of the comparator 24 at each sampling period by a sampling clock fed from a clock terminal 26. Further, the D latch 25 feeds its output for controlling the output of a one-bit D/A converter 23.

The one-bit D/A converter 23 feeds "+αV" when the D latch 25 feeds a value of "1" or "−αV" when the D latch 25 feeds a value of "0". The output of the converter 23 is added to an input analog audio signal through a resistor 18.

Figure 4A:
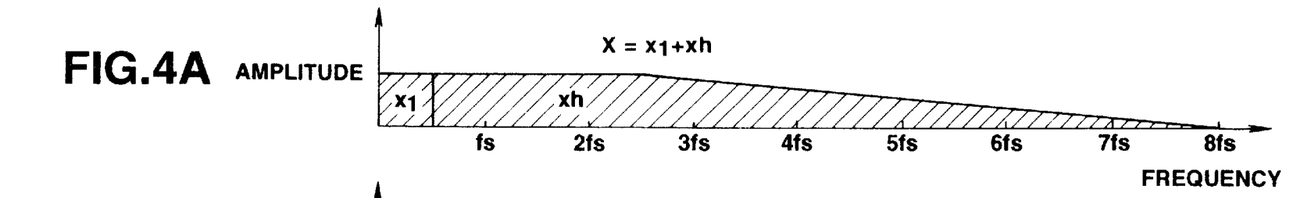
FIG. 4A is a graph showing a frequency characteristic of an output signal from the sigma-delta modulator 3 applied to the present invention.

The frequency characteristic of the 64×fs/1-bit digital signal fed from the signal-delta modulator 3 is shown in FIG. 4A. The frequency characteristic X of the 64×fs/1-bit digital signal is a sum of an audible band x1 of fs/2 or lower and a higher band xh out of an audible band than fs/2.

Figure 4B:
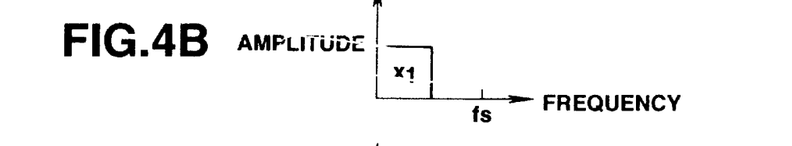
FIG. 4B is a graph showing a frequency characteristic of an output signal from a decimation filter 4 applied to the present invention.

The decimation filter 4 is operated to down-convert the one-bit digital signal of the frequency characteristic X and then feeds a fs/24-bit digital signal of the frequency characteristic x1 as shown in FIG. 4B.

Figure 4C:
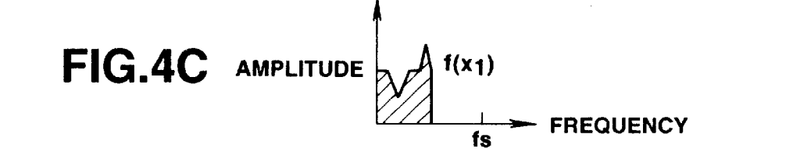
FIG. 4C is a graph showing a frequency characteristic of an output signal from a signal processing circuit 5 applied to the present invention.

The signal processing circuit 5 performs an equalizing process, for example, with respect to the fs/24-bit digital signal of the frequency characteristic x1 shown in FIG. 4B and feeds the fs/24-bit digital processing signal of the frequency characteristic f(x1) shown in FIG. 4C.

Figure 4D:
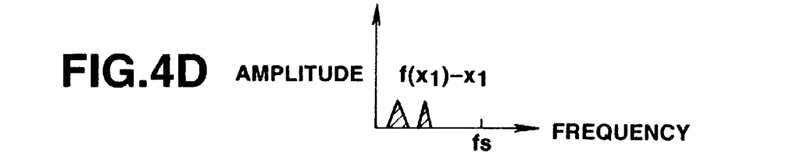
FIG. 4D is a graph showing a frequency characteristic of an output signal from a subtracter 7 applied to the present invention.

The subtracter 7 operates to subtract the fs/24-bit digital signal of the frequency characteristic x1 shown in FIG. 4B sent through the delay unit 6 from the fs/24-bit digital processing signal of the frequency characteristic f(x1) and output the fs/24-bit digital signal of the frequency characteristic f(x1)−x1 as shown in FIG. 4D.

Figure 4E:
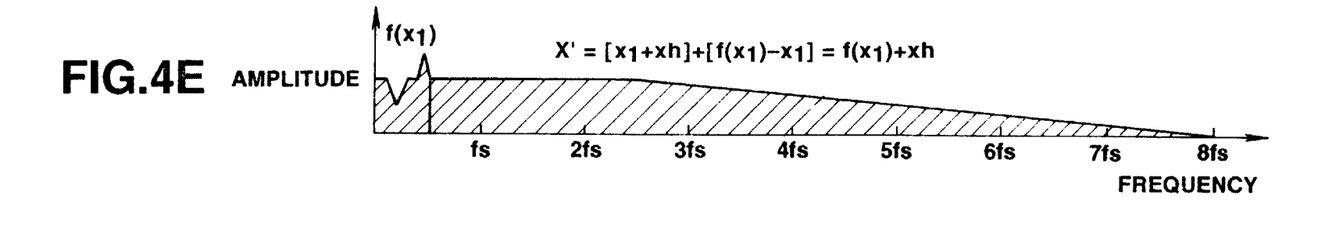
FIG. 4E is a graph showing a frequency characteristic of an output signal from a sigma-delta modulator 11 applied to the present invention.

The fs/24-bit digital signal of the frequency f(x1)−x1 as shown in FIG. 4D is over-sampled by the interpolation filter 8. The adder 10 operates to add the over-sampled 64 fs/24-bit output to the 64 fs/1-bit digital signal sent through the delay unit 9. Then, the sigma-delta modulator 11 operates to perform the sigma-delta modulation with respect to the 64×fs/25-bit added output from the adder 10 and then convert the modulated signal into the 64 fs/1-bit digital signal of the frequency characteristic X' as shown in FIG. 4E.

The 64×fs/1-bit digital signal of this frequency characteristic X' can be obtained by adding the signal on which the fs/24-bit digital signal of the frequency characteristic f(x1)−x1 as shown in FIG. 4D is over-sampled to the signal of the frequency characteristic X=x1+xh shown in FIG. 4A and then performing the sigma-delta modulation with respect to the added result. Hence, the frequency characteristic X' is represented as X'=[x1+xh]+[f(x1)−x1]=f(x1)+xh.

Then, the recording circuit 12 performs such a recording process as adding an error correcting sign to the 64×fs/1-bit digital signal of the frequency characteristic X'. Then, the bit stream of the one-bit digital signal is recorded on the magnetic tape 14 through the recording head 13.

The signal processing circuit 5 makes direct use of the existing circuit for processing a PCM signal. Hence, the circuit 5 has an excellent match to the current system. The output of the circuit 5, that is, the fs/24-bit digital signal is lead out of the output terminal 15 as the existing processed PCM signal.

From the aforementioned operation, the signal recording apparatus makes it possible to eliminate the costly signal processing circuit for the equalizing process, for example, with the sampling frequency of 64×fs and lots of DSPs. This results in reducing the signal recording apparatus in cost and size.

Moreover, the signal recording apparatus enables to process the signal with the direct use of the existing signal processing circuit for the PCM signal. This also results in reducing the cost of the apparatus burdened on the user.

Further, since the signal recording apparatus enables to pick up the signal of the existing digital audio format in processing the signal, the apparatus does not need to take the step of decimating the signal of the existing digital audio format from the one-bit digital signal.

Figure 5:
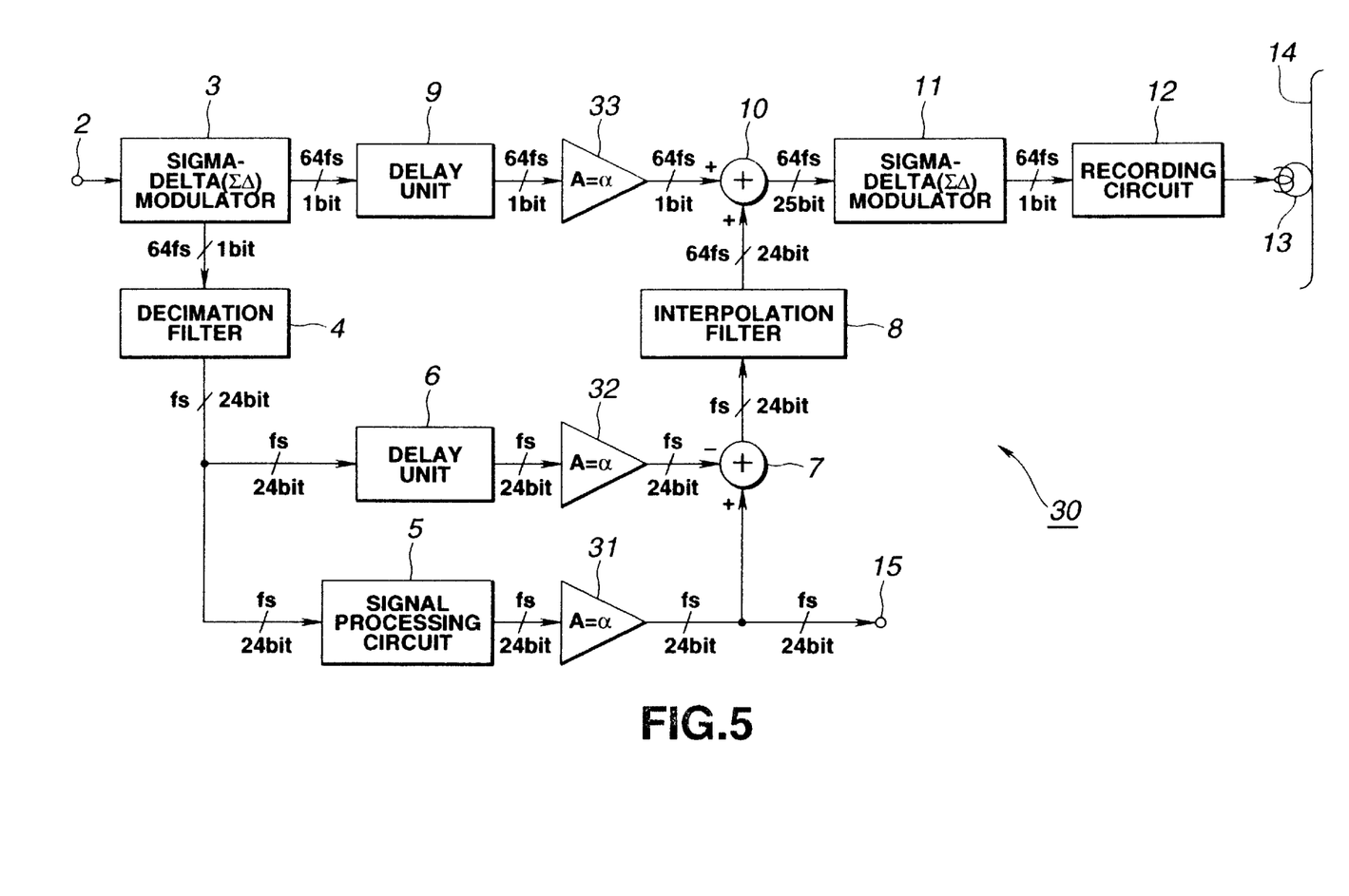
FIG. 5 is a block diagram showing a second embodiment of the present invention having a fader circuit added to the first embodiment of the invention.

In turn, the description will be oriented to the second embodiment of the present invention with reference to FIG. 5. Like the first embodiment, a signal recording apparatus 30 according to the second embodiment of the invention is arranged to perform a sound quality adjusting process such as an equalizing process with respect to the sigma-delta modulated one-bit digital signal, performing the recording process with respect to the adjusted signal, and then recording the resulting signal on the magnetic tape 14. The difference between the first and the second embodiments is that a fader 31 is located at a later stage than the signal processing circuit 5 so that a coefficient may be changed, for example, a gain of the equalized output is changed. Like the fader 31, faders 32 and 33 for changing the coefficients may be located at a later stage than the delay units 6 and 9, respectively. Later, like components of this embodiment to the signal recording apparatus 1 have like numerals and are not described hereafter.

The fader 31 is located between the signal processing circuit 5 and the subtracter 7 so that the gain of the equalized output from the signal processing circuit 5 may be attenuated or amplified. The fader 32 is located between the delay units 6 and 7 so that like the fader 31 the fader 31 may change the gain of the delayed output of the delay unit 6. The fader 33 is located between the delay unit 9 and the adder 10 so that like the faders 31 and 32 the fader 33 may change the gain of the delayed output from the delay unit 9.

As mentioned above, in the signal recording apparatus 30, the existing signal processing circuit 5 for the PCM signal performs the sound quality adjusting process such as an equalizing process with respect to the digital audio signal down-sampled by the decimation filter 4 and then the fader 31 handles the gain of the processed signal.

Next, the fader 32 operates to match the gain of the digital audio signal whose time base is corrected by the delay unit 6, sent from the decimation filter 4, to the gain adjusted by the fader 31. Then, the subtracter 7 operates to extract the difference between the processed data and the data from the delay unit 6 and feed it to the interpolation filter 8 in which the difference signal is interpolated on the data of the sampling frequency of the original one-bit sigma-delta modulated digital signal through the effect of the interpolation filter 8.

On the other hand, the fader 33 operates to match the original one-bit sigma-delta modulated digital signal whose time base is corrected by the delay unit 9 to the gain adjusted by the fader 31. The signal adjusted by the fader 33 is add to the difference data by the adder 10. This added output is modulated back into the one-bit sigma-delta modulated digital signal through the sigma-delta modulator 11. The resulting signal is the processed one-bit sigma-delta modulated digital signal.

Then, the recording circuit 12 performs such a recording process as adding an error correcting sign to the processed one-bit sigma-delta modulate digital signal. Then, a bit stream of the one-bit sigma-delta modulated signal is recorded on the magnetic tape 14 through the recording head 13.

At this time, the signal processing circuit 5 can make direct use of the existing digital signal processing apparatus for the PCM signal. Hence, the circuit 5 has an excellent matching characteristic to the existing system. The fs/24-bit digital signal is lead out of the output terminal 15 through the fader 31 as the existing PCM signal processed output.

As is understood from the above description, this signal recording apparatus 30 does not need an expensive signal processing circuit which uses a sampling frequency of 64×fs for the signal processing such as equalizing and lots of DSPs as well. The signal recording apparatus 30 can be reduced in cost and size.

Further, the signal recording apparatus 30 may use the existing signal processing circuit for the PCM signal for the signal processing, which leads to reduction of the cost burdened on the user.

Moreover, since the signal processing apparatus 30 enables to take out a signal of the existing digital audio format when processing the signal, the apparatus 30 does not need to take a step of decimating the one-bit digital signal to the signal of the existing digital audio format.

Figure 6:
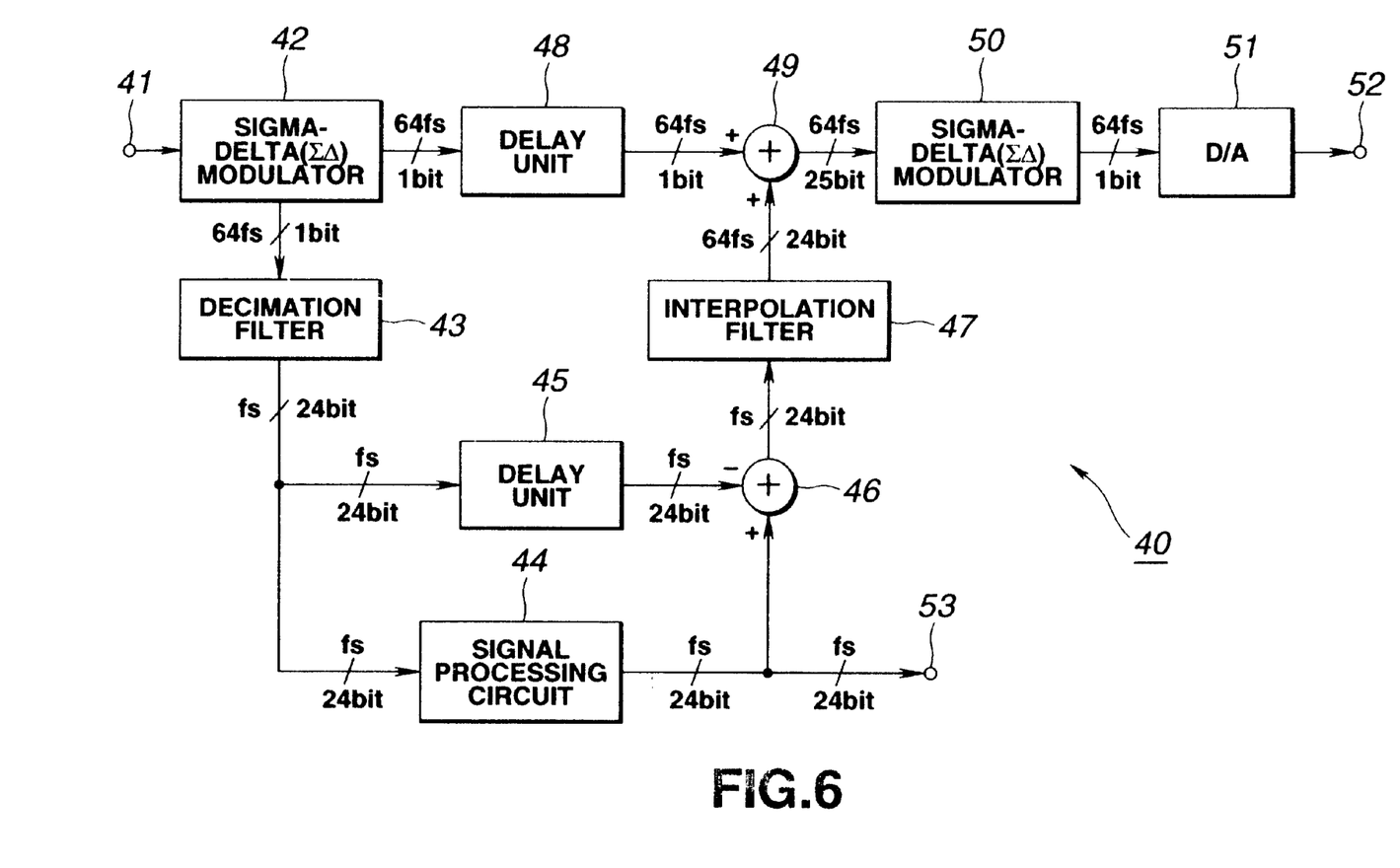
FIG. 6 is a block diagram showing an arrangement for processing a one-bit digital signal according to a third embodiment of the present invention.

In turn, the description will be oriented to the third embodiment of the present invention with reference to FIG. 6. The third embodiment of the present invention concerns with a signal reproducing apparatus 40 which performs a sound quality process such as equalizing with respect to a one-bit digital signal obtained by a sigma-delta modulator 42 and then converts the processed signal into an analog audio signal.

The one-bit digital signal fed by the sigma-delta modulator 42 is generated at a sampling frequency of 64×fs in which the sampling frequency fs (=44.1 KHz) is used for a compact disk, for example.

Later, the signal reproducing apparatus 40 will be described.

The one-bit digital signal reproduced from a recording medium 59 with a reproduction head 60 is processed by a reproducing circuit 61 and then is applied to a decimation filter 43 and a delay unit 48.

When the signal is reproduced by an analog reproducing apparatus, the analog audio signal applied at an input terminal 41 is sigma-delta modulated by the sigma-delta modulator 42 for generating a one-bit digital signal sampled at the sampling frequency 64×fs. Then, a decimation filter 43 operates to down-sample the one-bit digital signal into a 24-bit digital signal sampled at the sampling frequency fs, for example. Next, a signal processing circuit 44 performs a sound quality adjusting process such as equalizing with respect to the fs/24-bit digital signal sent from the decimation filter 43. The fs/24-bit digital signal from the decimation filter 43 is applied to a delay unit 49 in which the signal is delayed by a time corresponding to the processing time required by the signal processing circuit 44. Next, a subtracter 46 operates to subtract the fs/24-bit digital output signal from the signal processing circuit 44 from the fs/24-bit digital delay signal from the delay unit 45. The difference therebetween from the subtracter 46 is delayed by the delay unit 48 by the processing time required while the 64 fs/1-bit digital signal is passed from the sigma-delta modulator 42 to an interpolation filter 47 through a decimation filter 43, a signal processing circuit 44, and a subtracter 46. The interpolation filter 47 applies the 64×fs/24-bit digital signal and the delay unit 45 applies the 64−fs/1-bit digital signal into an adder 49 for adding both of the signals to each other. The 64×fs/25-bit digital signal from the adder 49 is converted back into the 64×fs/1-bit digital signal through the effect of the sigma-delta modulator 50. The 64×fs/1-bit digital signal from the sigma-delta modulator 50 is converted into an analog signal through the effect of a D/A converter 51. The analog audio signal from this D/A converter 51 is output at an output terminal 52 as a one-bit digital signal.

This signal reproducing apparatus 40 operates to feed the 64×fs/1-bit digital signal from the sigma-delta modulator 42 into two system sides, that is, the decimation filter 43 side and the delay unit 48 side.

In the decimation filter 43 system, the one-bit digital signal sampled at the sampling frequency 64×fs is down-converted to the lowest processable audible band.

The signal processing circuit 44 performs an equalizing process, for example, with respect to the down-converted output from the decimation filter 43. Then, the subtracter 46 operates to subtract the delayed output from the delay unit 45 from the equalized output for the purpose of extracting only the audible band to be equalized by the signal processing circuit 4.

The fs/24-bit digital signal with only this audible band is over-sampled to 64×fs/24-bit digital signal through the interpolation filter 47 and then is added to the delayed output fed from the delay unit 48 on the other system by the adder 49.

The adder 49 operates to add the 64×fs/24-bit digital signal containing the equalized audible band obtained by one system to the 64×fs/1-bit digital signal containing the information out of the audible band by the other system, and then the resulting 64×fs/25-bit digital signal is supplied to the sigma-delta modulator 50.

The sigma-delta modulator 50 performs the sigma-delta modulation with respect to the 64×fs/25-bit digital signal. Then, the signal is converted back into the 64×fs/1-bit digital signal. This 64×fs/1-bit digital signal is converted into an analog audio signal through the effect of a D/A converter 51. The concrete arrangement of the sigma-delta modulator 42 is shown in FIG. 3. Hence, the description thereabout is left out.

The signal processing circuit 44 makes direct use of the existing processing circuit for the PCM signal and thus has an excellent matching characteristic to the existing system. The output of the circuit 44, that is, the fs/24-bit digital signal is led out of an output terminal 53 as the existing PCM processed signal.

As is understood from the above description, this signal reproducing apparatus 40 does not need to eliminate an expensive signal processing circuit which uses the sampling frequency of 64×fs for signal processing such as equalizing and lots of DSPs as well. This apparatus 40 is reduced in size and cost.

Further, since the signal reproducing apparatus 40 uses the existing signal processing circuit for the PCM without any change, the cost burdened on the user of the apparatus 40 is made lower.

Moreover, since the signal reproducing apparatus 40 is able to take out a signal of the existing digital audio format when processing the signal, the apparatus 40 does not need to take the step of decimating the one-bit digital signal into the signal of the existing digital audio format.

Figure 7:
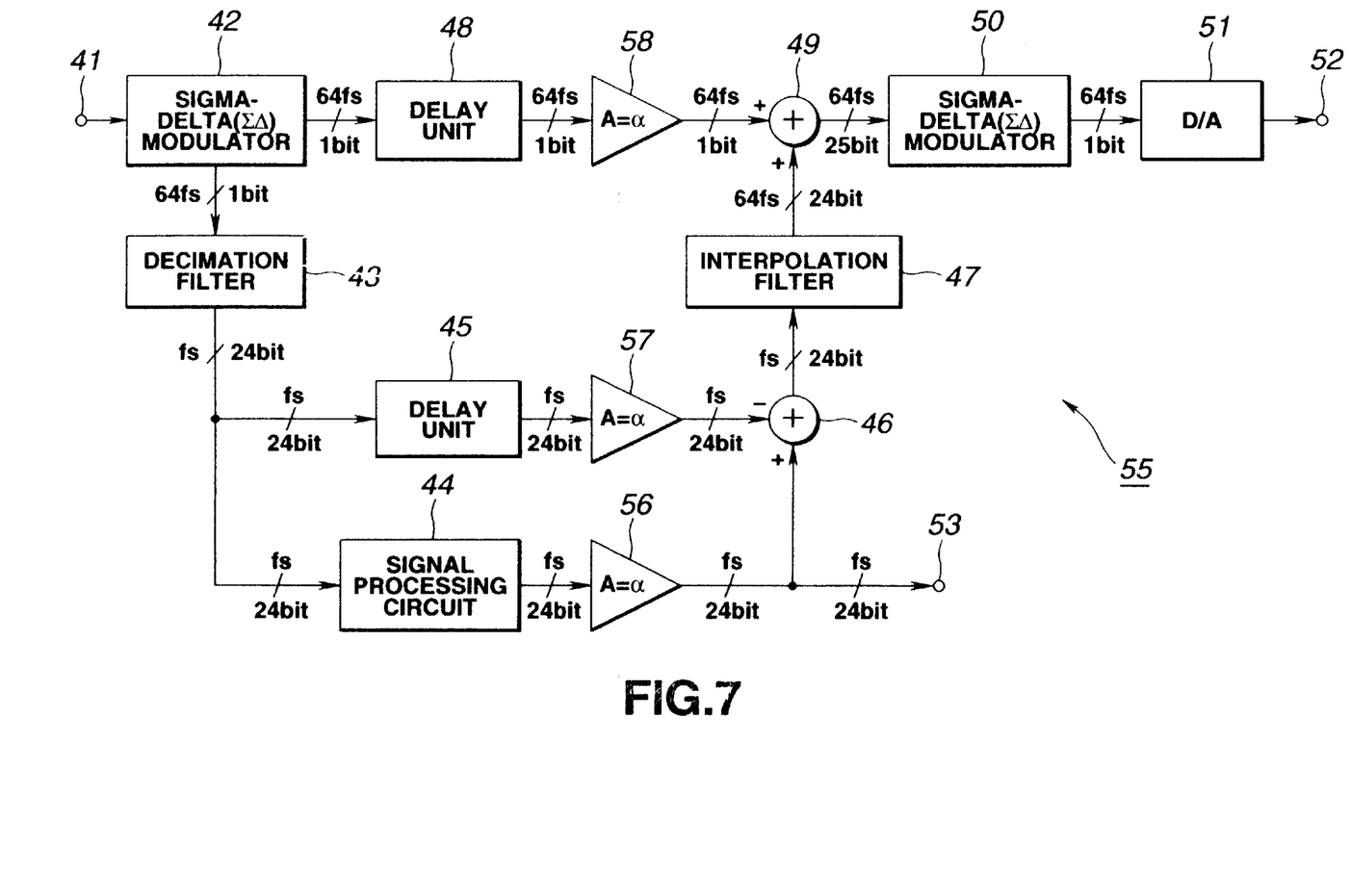
FIG. 7 is a block diagram showing an arrangement for processing a one-bit digital signal according to a fourth embodiment of the present invention.

In turn, the description will be oriented to a fourth embodiment of the invention with reference to FIG. 7. The fourth embodiment of the invention concerns with a signal reproducing apparatus 55 which performs a sound quality adjusting process such as equalizing with respect to the sigma-delta modulated one-bit digital signal and then reproduces it. The difference between this signal reproducing apparatus 55 and the foregoing signal reproducing apparatus 40 is that a fader 56 is located at a later stage than the signal processing circuit 44 so that the fader 56 may change the coefficient for changing a gain of the equalized output. In addition, like the fader 56, faders 57 and 58 are located at later stages than the delay units 45 and 48 respectively, for changing the coefficients. The same components of this apparatus 56 as the foregoing apparatus 40 have like numerals and thus are not described here.

The fader 56 is located between the signal processing circuit 44 and the subtracter 46 so that the fader 56 may change the coefficient for attenuating or amplifying the gain of the equalized output from the signal processing circuit 44. The fader 57 is located between the delay unit 45 and the subtracter 46 so that the fader 57 may change the coefficient for changing the gain of the delayed output of the delay unit 45 like the fader 56. The fader 58 is located between the delay unit 48 and the adder 49 so that the fader 58 may change the coefficient for changing the gain of the delayed output of the delay unit 48 like the faders 56 and 57.

That is, this signal reproducing apparatus 55 uses the signal processing circuit 44 for the existing PCM signal for performing a sound quality adjusting process such as equalizing with respect to the digital audio signal down-sampled by the decimation filter 43. Then, the apparatus 55 uses the fader 56 for changing the gain of the processed digital audio signal.

Next, the digital audio signal whose time base is corrected sent from the decimation filter 43 is adjusted by the fader 57 to have the same gain as that adjusted by the fader 56. Then, the difference between the signal from the delay unit 45 and the signal from the signal processing circuit 44 is extracted by the subtracter 46. The difference data passes through the interpolation filter 47 for interpolating the data into the data with the sampling frequency of the original one-bit sigma-delta modulated digital signal.

On the other hand, the original one-bit sigma-delta modulated digital signal whose time base is corrected by the delay unit 48 is adjusted by the fader 58 to have the same gain as that adjusted by the fader 56 and then is added to the interpolated difference data through the effect of the adder 49. The added result is modulated back into the one-bit sigma-delta modulated digital signal through the effect of the sigma-delta modulator 50. The resulting signal is made to be the processed one-bit sigma-delta modulated digital signal.

Then, the processed one-bit sigma-delta modulated digital signal is converted into an analog audio signal by the D/A converter 51 and then is led out of an output terminal 52.

At this time, the signal processing circuit 44 makes direct use of the digital signal processing device for the existing PCM signal and thus has an excellent matching characteristic to the existing system. Further, the fs/24-bit digital signal is led out of the output terminal through the fader 56 as the existing PCM signal processed output.

As is understood from the above description, this signal reproducing apparatus 55 does not need an expensive signal processing circuit which uses the sampling frequency of 64×fs for signal processing such as equalizing and lots of DSPs as well. Hence, the apparatus 55 can be reduced in cost and scale.

Further, the signal reproducing apparatus 55 may use the signal processing circuit for the existing PCM signal for the signal processing. Hence, the cost burdened on the user of the apparatus 56 is made lower.

Moreover, since the signal reproducing apparatus 55 can take out a signal of the existing digital audio format when processing the signal, this apparatus 55 does not need to take a step of decimating the one-bit digital signal into the signal of the existing digital audio format.

Figure 8:
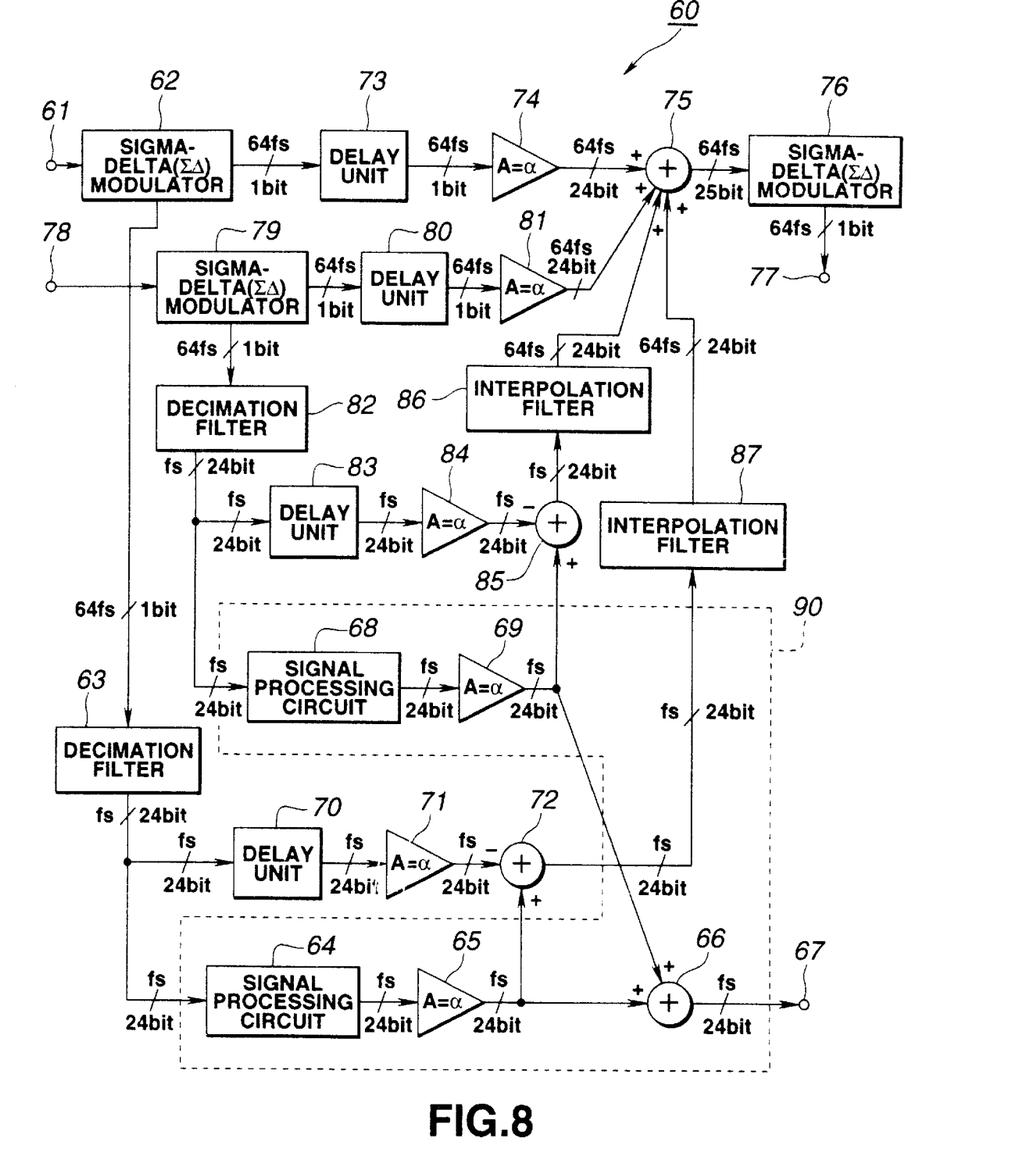
FIG. 8 is a block diagram showing an arrangement for processing a one-bit digital signal according to a fifth embodiment of the present invention.

In turn, the description will be oriented to a fifth embodiment of the present invention with reference to FIG. 8. The fifth embodiment of the invention concerns with a mixing apparatus 60 which takes the steps of modulating analog audio signals of a right and a left channels applied from an input terminal 61 and an input terminal 78 into the corresponding one-bit sigma-delta modulated digital signals through the effect of sigma-delta modulators 62 and 79, respectively, performs a sound quality process such as an equalizing process with respect to the modulated signals, mixes these signals, and modulates back the mixed signal into a one-bit sigma-delta modulate digital signal to feed the signal.

The one-bit digital signals fed by the sigma-delta modulators 62 and 79 are generated at a sampling frequency 64×fs in which the sampling frequency fs (=44.1 KHz) is used for a compact disk, for example.

This mixing apparatus 60 provides a left channel processing system for processing an analog audio signal of a left channel and a right channel processing system for processing an analog audio signal of a right channel. The digital signals from these two systems are added by an adder 75. The added signal is applied into a sigma-delta modulator 76 in which the signal is modulated back into a one-bit digital signal. Then, the one-bit digital signal is led out of an output terminal 77. The signal processed outputs from the signal processing circuits 64 and 68 (to be described below) of these two systems are passed through faders 65 and 69 and then synthesized through an adder 66. The synthesized signal is taken out of an output terminal 67 as the PCM modulated output.

At first, in the left channel processing system, the left-channel analog audio signal applied at the input terminal 61 is sigma-delta modulated by the sigma-delta modulator 62 for generating the left one-bit digital signal sampled at the sampling frequency 64×fs. The 64×fs/1-bit digital signal is down-sampled into a 24-bit digital signal sampled at the sampling frequency fs, for example, through the effect of a decimation filter 63. Then, the signal processing circuit 64 performs a sound quality adjusting process such as equalizing with respect to the fs/24-bit digital signal from the decimation filter 63. The fs/24-bit digital signal from the decimation filter 63 is delayed by a delay unit 70 by the time corresponding to the processing time consumed by the signal processing circuit 64. Next, the fader 65 operates to multiply a coefficient by the fs/24-bit digital signal from the signal processing circuit 64 for adjusting the gain of the signal. Then, the fader 71 operates to multiply a coefficient by the fs/24-bit digital delayed signal from the delay unit 70 for adjusting the gain. Next, a subtracter 72 operates to substrate the output of the fader 65 from the output of the fader 71. The difference of the fs/24-bit digital signal from this subtracter 72 is delayed by a delay unit 73 by the time corresponding to the total processing time required for the decimation filter 63, the signal processing circuit 64, the fader 65, the subtracter 72, and the interpolation filter 87. The gain of the output of the delay unit 73 is adjusted by the fader 74.

Further, in the right channel processing system, the analog audio signal of the right channel applied at an input terminal 78 is sigma-delta modulated into the one-bit digital signal sampled at the sampling frequency 64×fs by a sigma-delta modulator 79. The one-bit digital signal is down-sampled into a 24-bit digital signal sampled at the sampling frequency fs, for example, through the effect of a decimation filter 82. Then, the signal processing circuit 68 performs a sound quality adjusting process such as equalizing with respect to the fs/24-bit digital signal from the decimation filter 82. The fs/24-bit digital signal from the decimation filter 82 is delayed by a delay unit 83 by the time corresponding to the processing time required by the signal processing circuit 68. Next, the fader 69 operates to multiply the coefficient by the fs/24-bit digital signal from the signal processing circuit 68 for adjusting the gain. Then, the fader 84 operates to multiply the coefficient by the fs/24-bit digital delayed by the delay unit 83 for adjusting the gain. Next, the difference between the outputs of the faders 69 and 84 is derived by a subtracter 85. The difference from the subtracter 85 is over-sampled into the 64×fs/24-bit digital signal through an interpolation filter 86. The 64×fs/1-bit digital signal from the sigma-delta modulator 79 is delayed by a delay unit 80 by the time corresponding to the total processing time required by the decimation filter 82, the signal processing circuit 68, the fader 69, the subtracter 85, and the interpolation filer 86. The gain of the delayed output from the delay unit 80 is adjusted by the fader 81.

The signal processing circuit 64 performs an equalizing process with respect to the down-converted output from the decimation filter 63 provided in the left channel processing system. The fader 65 changes the coefficient for attenuating or amplifying the gain of the equalized output. The fader 71 changes the coefficient for adjusting the gain of the delayed output from the delay unit 70.

The subtracter 72 operates to subtract the delayed output sent through the fader 71 from the equalized output sent through the fader 65. This operation makes it possible to extract only the audible band to be equalized by the signal processing circuit 64.

This fs/24-bit digital signal with only the audible band is over-sampled onto the 64×fs/24-bit digital signal through the effect of the interpolation filter 87 and then is fed to the adder 75.

On the other hand, the down-converted output from the decimation filter 82 provided in the right channel processing system is equalized by the signal processing circuit 68. The fader 69 changes the coefficient in a manner to attenuate or amplify the gain of the equalized output. The fader 84 changes the coefficient for adjusting the gain of the delayed output from the delay unit 83.

The subtracter 85 operates to subtract the delayed output sent through the fader 84 from the equalized output sent through the fader 69. This operation makes it possible to extract only the audible band to be equalized by the signal processing circuit 68. The fs/24-bit digital signal with only the audible band is over-sampled onto the 64×fs/24-bit digital signal through the effect of the interpolation filter 86 and then is fed to the adder 75.

The adder 75 receives the 64×fs/24-bit digital signal in which the gain of the delayed output from the delay unit 73 of the left channel processing system is adjusted by the fader 74 and the 64×fs/24-bit digital signal in which the gain of the delayed output from the delay unit 80 of the right channel processing system is adjusted. The input timings of the signals to this adder 75 are adjusted to be equal to each other by the delay units 70, 73, 83 and 80, respectively.

Hence, the adder 75 operates to mix the digital signal whose sound quality is adjusted for the left channel processing system with the digital signal whose sound quality is adjusted for the right channel processing system and then feed the resulting 64×fs/25-bit digital signal to the sigma-delta modulator 76. The sigma-delta modulator 76 performs the sigma-delta modulation with respect to the 64×fs/25-bit mixed digital signal and then is led out of an output terminal 77 as the 64×fs/1-bit sigma-delta modulated signal.

The signal processing circuit 64, the fader 65, the adder 66, the signal processing circuit 68, and the fader 69 provided in this mixing apparatus 60 compose a mixing console 90 in the existing digital audio system. Hence, this mixing apparatus 60 is arranged to realize a digital mixing console for the one-bit sigma-delta modulated digital signal merely by adding another processing circuit to the conventional mixing console 90 as an additional circuit. It means that this mixing apparatus 60 may make good use of the expensive existing digital mixing console.

Further, this mixing apparatus 60 operates to supply the fs/24-bit digital audio signal at the output terminal 67. This digital audio signal may be used in the existing PCM digital audio system.

The signal processing apparatus according to the present invention is arranged to take the steps of down-sampling the one-bit digital signal sampled at the sampling frequency N×fs into a multi-bit signal sampled at the sampling frequency fs through the effect of the down-sampling means and performing a predetermined signal processing with respect to the multi-bit signal through the effect of the signal processing means. Then, the multi-bit signal, which is an output down-sampled by the down-sampling means, is delayed by a given time by the first delay means. The delayed output is subtracted from the output of the signal processing means by the operating means. The difference from the operating means is over-sampled onto the multi-bit signal sampled at the sampling frequency N×fs (N is an integer greater than 1). The over-sampled output from this over-sampling means is added by the adding means to the one-bit digital signal sampled at the sampling frequency N×fs delayed by a given time by the second delay means. The added result from the adding means is transformed back into the one-bit digital signal sampled at the sampling frequency N×fs and then is fed out of the signal processing apparatus. Hence, this signal processing apparatus enables to implement the signal processing such as equalizing with the small-scaled and inexpensive hardware.

The signal recording apparatus according to the present invention is arranged to down-sample the one-bit digital signal sampled at the sampling frequency N×fs obtained by the sigma-delta modulation into the multi-bit signal sampled at the sampling frequency fs through the effect of the down-sampling means and perform a sort of predetermined signal processing with respect to the multi-bit signal through the effect of the signal processing means. The multi-bit signal, which is the output down-sampled by the down-sampling means, is delayed by a given time by the first delay means. The delayed output is subtracted from the output processed by the signal processing means by the operating means. The difference from the operating means is over-sampled onto the multi-bit signal sampled at the sampling frequency N×fs through the effect of the over-sampling means. The output from this over-sampling means is added by the adding means to the one-bit digital signal sampled at the sampling frequency N×fs delayed by a given time by the second delay means. The added result from the adding means is transformed back into the one-bit digital signal sampled at the sampling frequency N×fs through the effect of the sigma-delta modulating means and is recorded on the recording medium by the recording means. Hence, the signal recording apparatus enables to implement the signal processing such as equalizing with small-scaled and inexpensive hardware.

The signal reproducing apparatus according to the present invention is arranged to down-sample the one-bit digital signal sampled at the sampling frequency N×fs obtained by the sigma-delta modulation into the multi-bit signal sampled at the sampling frequency fs through the effect of the down-sampling means and perform a sort of signal processing with respect to the multi-bit signal through the effect of the signal processing means. The multi-bit signal, which is an output down-sampled by the down-sampling means, is delayed by a given time by the first delay means. The delayed output is subtracted from the output processed by the signal processing means by the operating means. The difference from the operating means is over-sampled onto the multi-bit signal sampled at the sampling frequency N×fs through the effect of the over-sampling means. The output over-sampled by the over-sampling means is added by the adding means to the one-bit digital signal sampled at the sampling frequency N×fs delayed by a given time by the second delay means. Then, the added result from the adding means is transformed back into the one-bit digital signal sampled at the sampling frequency N×fs through the effect of the sigma-delta modulating means. The one-bit digital signal is converted into an analog signal through the effect of the analog converting means. Hence, the signal reproducing apparatus enables to implement the signal processing such as equalizing with small-scaled and inexpensive hardware.

What is claimed is:

1. A signal processing apparatus for processing a one-bit digital signal with one quantizing bit, sampled at a sampling frequency N×fs (Hz) (N is an integer greater than 1, fs meets the relation fs'×2≦fs (Hz) in which fs' is an audible band frequency), through a sigma-delta modulating system comprising:

first converting means for converting said one-bit digital signal into a converted digital signal having a sampling frequency of fs (Hz) and quantizing multi-bits;

signal processing means for processing said converted digital signal and forming a processed digital signal and quantizing the multi-bits converted by said first converting means and forming a processed digital signal;

first delay means for delaying said converted digital signal and forming a first delayed signal and quantizing the multi-bits converted by said first converting means by a given time;

second delay means for delaying a digital signal having a sampling frequency of N×fs (Hz) and one quantizing bit derived by said sigma-delta modulating system by a given time; and first operating means for deriving a difference between said processed digital signal of said signal processing means and said first delayed signal of said first delay means;

second converting means for converting said difference from said first operating means into a digital signal having a sampling frequency N×fs (Hz) and quantizing multi-bits;

second operating means for adding an output signal of said second converting means to an output signal of said second delay means forming an added result signal; and sigma-delta modulating means for re-quantizing the added result signal from said second operating means into a digital signal having the sampling frequency N×fs (Hz) and one quantizing bit.

2. The signal processing apparatus as claimed in claim 1, further comprising:
   coefficient changing means located between said signal processing means and said first operating means.

3. The signal processing apparatus as claimed in claim 1, further comprising:
   coefficient changing means located between said first delay means and said first operating means.

4. The signal processing apparatus as claimed in claim 1, further comprising:
   coefficient changing means located between said second delay means and said second operating means.

5. The signal processing apparatus as claimed in claim 1, wherein a delay time of said first delay means corresponds to a processing time required by said signal processing means.

6. The signal processing apparatus as claimed in claim 1, wherein a delay time of said second delay means corresponds to all processing times of said first operating means, said first converting means, said second converting means, and said signal processing means.

7. A recording apparatus for recording on a recording medium a digital signal with one quantizing bit, sampled at a sampling frequency N×fs (Hz) (N is an integer greater than 1 and fs meets the relation of fs'×2≦fs (Hz) in which fs' is an audible band frequency) through a sigma-delta modulating system, comprising:

first converting means for converting said one-bit digital signal into a converted digital signal having a sampling frequency of fs (Hz) and quantizing multi-bits;

signal processing means for processing said converted digital signal having said sampling frequency of fs (Hz) and quantizing the multi-bits converted by said first converting means;

first delay means for delaying said converted digital signal and quantizing the multi-bits converted by said first converting means by a given time;

second delay means for delaying a digital signal having said sampling frequency of N×fs (Hz) and one quantizing bit derived through said sigma-delta modulating system by a given time;

first operating means for deriving a difference between an output signal of said signal processing means and an output signal of said first delay means;

second converting means for converting said difference from said first operating means into a digital signal having said sampling frequency of N×fs (Hz) and quantizing multi-bits;

second operating means for adding an output signal of said second converting means to an output signal of said second delay means and forming an added result signal;

sigma-delta modulating means for re-quantizing the added result signal of said second operating means into a resultant digital signal having said sampling frequency of N×fs (Hz) and one quantizing bit;

first recording means for performing a predetermined signal process with respect to said resultant digital signal and one quantizing bit modulated by said sigma-delta modulating means; and second recording means for recording on a recording medium a one-bit digital signal processed by said first recording means.

8. The recording apparatus as claimed in claim 7, further comprising:
coefficient changing means located between said signal processing means and said first operating means.

9. The recording apparatus as claimed in claim 7, further comprising:
coefficient changing means located between said first delay means and said first operating means.

10. The recording apparatus as claimed in claim 7, further comprising:
coefficient changing means located between said second delay means and said second operating means.

11. The recording apparatus as claimed in claim 7, wherein a delay time of said first delay means corresponds to a processing time required by said signal processing means.

12. The recording apparatus as claimed in claim 7, wherein a delay time of said second delay means corresponds to all processing times of said first operating means, said first converting means, said second converting means, and said signal processing means.

13. A reproducing apparatus for reproducing a one-bit digital signal from a recording medium on which is recorded a digital signal with one quantizing bit, sampled at a sampling frequency N×fs (Hz) (N is an integer greater than 1 and fs meets the relation of fs'×2≦fs (Hz) in which fs' is an audible band frequency) through a sigma-delta modulator system comprising:
reproducing means for reproducing a one-bit digital signal from said recording medium;
first converting means for converting said one-bit digital signal reproduced from said reproducing means into a converted digital signal having said sampling frequency of fs (Hz) and quantizing multi-bits;
signal processing means for processing said converted digital signal having said sampling frequency of fs (Hz) and quantizing the multi-bits converted by said first converting means;
first delay means for delaying said converted digital signal and quantizing the multi-bits converted by said converting means by a given time;
second delay means for delaying a digital signal having said sampling frequency of N×fs (Hz) and one quantizing bit derived through said sigma-delta modulating system by a given time;
first operating means for deriving a difference between an output signal of said signal processing means and an output signal of said first delay means;
second converting means for converting said difference from said first operating means into a digital signal having said sampling frequency of N×fs (Hz) and quantizing multi-bits;
second operating means for adding an output signal of said second converting means to an output signal of said second delay means and forming an added result signal; and
sigma-delta modulating means for re-quantizing the added result signal of said second operating means into a digital signal having said sampling frequency of N×fs (Hz) and one quantizing bit.

14. The reproducing apparatus as claimed in claim 13, further comprising:
coefficient changing means located between said signal processing means and said first operating means.

15. The reproducing apparatus as claimed in claim 13, further comprising:
coefficient changing means located between said first delay means and said first operating means.

16. The reproducing apparatus as claimed in claim 13, further comprising:
coefficient changing means located between said second delay means and said second operating means.

17. The reproducing apparatus as claimed in claim 13, wherein a delay time of said first delay means corresponds to a processing time required by said signal processing means.

18. The reproducing apparatus as claimed in claim 13, wherein a delay time of said second delay means corresponds to all processing times required by said first operating means, said first converting means, said second converting means, and said signal processing means.

19. A mixing apparatus for receiving digital signals, each signal having one quantizing bit sampled at a sampling frequency N×fs (Hz) (N is an integer greater than 1 and fs meets the relation of fs'×2≦fs (Hz) in which fs' is an audible band frequency) and mixing a plurality of one-bit digital signals of m channels (m is an integer greater than 1) through a sigma-delta modulator system, comprising:
first converting means for converting each of a plurality of one-bit digital signals of m channels into a digital signal having a sampling frequency fs (Hz) and quantizing multi-bits;
signal processing means for processing each of said digital signals of m channels, each digital signal having said sampling frequency fs (Hz) and quantizing the multi-bits converted by said first converting means;
first delay means for delaying each of said plurality of digital signals of m channels, each signal having said sampling frequency fs (Hz) and quantizing the multi-bits converted by said first converting means by a given time;
second delay means for delaying each of a plurality of digital signals of m channels, each signal having said sampling frequency N×fs (Hz) and one quantizing bit derived through said sigma-delta modulating system by a given time;
first operating means for deriving a difference between an output signal of each of said m channels provided in said signal processing means and an output signal of each of said m channels provided in said first delay means;
second converting means for converting said difference of each of said m channels of said second converting means into a digital signal having said sampling frequency of N×fs (Hz) and quantizing multi-bits;
second operating means for adding an output signal of each channel of said second converting means to an output signal of each channel of said second delay means and forming an added result signal; and
sigma-delta modulating means for re-quantizing the added result signal from said second operating means into a digital signal having said sampling frequency of N×fs (Hz) and one quantizing bit.

20. The mixing apparatus as claimed in claim 19, further comprising:
coefficient changing means for each channel located between said first delay means and said first operating means.

21. The mixing apparatus as claimed in claim 19, further comprising:
coefficient changing means for each channel located between said first delay means and said first operating means.

22. The mixing apparatus as claimed in claim 19, further comprising:
coefficient changing means for each channel located between said second delay means and said second operating means.

23. The mixing apparatus as claimed in claim 19, wherein a delay time of said first delay means corresponds to a processing time required by said signal processing means.

24. The mixing apparatus as claimed in claim 19, wherein a delay time of said second delay means corresponds to all processing times required by said first operating means, said first converting means, said second converting means, and said signal processing means.

* * * * *